United States Patent
Kamikisaki

(10) Patent No.: US 8,115,664 B2
(45) Date of Patent: Feb. 14, 2012

(54) A/D CONVERSION DEVICE

(75) Inventor: Sumiyuki Kamikisaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 132 days.

(21) Appl. No.: 12/755,902

(22) Filed: Apr. 7, 2010

(65) Prior Publication Data

US 2010/0289681 A1    Nov. 18, 2010

(30) Foreign Application Priority Data

May 13, 2009    (JP) .................. 2009-116789

(51) Int. Cl.
*H03M 1/34*    (2006.01)

(52) U.S. Cl. .................. 341/155; 341/163; 341/164

(58) Field of Classification Search .................. 341/155, 341/163, 164

See application file for complete search history.

(56) References Cited

U.S. PATENT DOCUMENTS

| | | | | |
|---|---|---|---|---|
| 3,153,142 | A | * | 10/1964 | Hellerman ............ 341/165 |
| 4,112,500 | A | * | 9/1978 | Peters .................. 341/144 |
| 4,454,500 | A | * | 6/1984 | Kato et al. ............ 341/108 |
| 6,075,478 | A | * | 6/2000 | Abe .................... 341/155 |
| 7,405,689 | B2 | | 7/2008 | Kernahan et al. |
| 7,609,185 | B2 | | 10/2009 | Kernahan et al. |
| 8,004,442 | B2 | * | 8/2011 | Barrenscheen et al. ...... 341/155 |

FOREIGN PATENT DOCUMENTS

| | | | |
|---|---|---|---|
| JP | 56-13830 A | | 2/1981 |
| JP | 61-125231 A | | 6/1986 |
| JP | 01161922 A | * | 6/1989 |
| JP | 10303751 A | * | 11/1998 |
| KR | 10-2007-0106508 A | | 11/2007 |

* cited by examiner

*Primary Examiner* — Howard Williams

(74) *Attorney, Agent, or Firm* — Foley & Lardner LLP

(57) ABSTRACT

An exemplary embodiment of the present invention is an A/D conversion device including: a sample-and-hold circuit that holds an analog input voltage; a sequential conversion register that stores a digital value corresponding to a threshold; a D/A converter that generates an analog voltage corresponding to the digital value stored in the sequential conversion register; a comparator that compares an analog voltage output from the sample-and-hold circuit with an analog voltage obtained from the D/A converter, and outputs a comparison result; a comparison result counter that outputs a determination result according to a count number counted based on the comparison result; and a control circuit that performs control for switching from the comparator function to the A/D conversion function, based on the determination result. During operation of the A/D conversion function, the sequential conversion register sequentially converts the analog voltage held in the sample-and-hold circuit into a digital value.

10 Claims, 7 Drawing Sheets

A/D CONVERSION DEVICE

INCORPORATION BY REFERENCE

This application is based upon and claims the benefit of priority from Japanese patent application No. 2009-116789, filed on May 13, 2009, the disclosure of which is incorporated herein in its entirety by reference.

BACKGROUND

1. Field of the Invention

The present invention relates an A/D conversion device, and more particularly, to an A/D conversion device capable of switching between a comparator function and an A/D conversion function in a system that performs a feedback control with respect to an analog input within a specified range.

2. Description of Related Art

As response times for an embedded-type control become faster, there is a demand for a high-speed A/D conversion device. Especially in the field of motor control, there is an increasing demand for shortening a processing time from sensing of an analog output, such as position information or a current value output from a motor, to execution of a feedback control.

To achieve a reduction in A/D conversion time, there is disclosed an A/D conversion device capable of switching between a comparator function and an A/D conversion function (e.g., see Japanese Unexamined Patent Application Publication No. 61-125231). FIG. 5 is a block diagram showing the configuration of the A/D conversion device according to a prior art disclosed in Japanese Unexamined Patent Application Publication No. 61-125231.

Referring to FIG. 5, reference numeral 108 denotes a holding register, and reference numeral 107 denotes a shift register that sets a predetermined value to the holding register 108 at each clock input. Reference numeral 109 denotes a three-output (three-state) buffer that receives an output from the holding register 108. Reference numeral 111 denotes a reference supply of a D/A converter 110. Reference numeral 112 denotes a comparator that receives an analog output signal from the D/A converter 110 and an analog signal to be measured, and outputs a comparison result to the holding register 108. The shift register 107, the holding register 108, the three-output (three-state) buffer 109, the D/A converter 110, the reference supply 111, and the comparator 112 constitute a main part of the A/D conversion device.

Reference numeral 106 denotes an 8-bit microcomputer that controls the main part of the A/D conversion device. After A/D conversion is completed, ports P0.0 to P0.7 of the microcomputer 106 receive digital values held in the holding register 108, and directly output predetermined digital values to the D/A converter 110. A port P1.1 outputs a signal indicating the start of the A/D conversion, to each of the shift register 107 and the holding register 108. A port P1.2 receives an A/D conversion end signal from the holding register 108. A port P1.3 outputs a control signal to the three-output buffer 109. A port P1.0 receives an output from the comparator 112.

The main part of the A/D conversion device of the prior art configured as described above allows the three-output buffer 109 to operate normally, thereby enabling A/D conversion of a sequential comparison type.

The A/D conversion device of the prior art shown in FIG. 5 can also be operated as a digital comparator in the following manner. That is, first, the signal from the port P1.3 of the microcomputer 106 places the three-output buffer 109 into a floating state, and predetermined set values are output from the ports P0.0 to P0.7 to the D/A converter 110. The set values are subjected to D/A conversion by the D/A converter 110, and set analog values thus obtained are input to the plus terminal of the comparator 112. Then, the comparator 112 compares the set analog values with a measured analog value $V_{in}$ and outputs a comparison result to the port P1.0 of the microcomputer 106. The microcomputer 106 checks whether the value input to the port P1.0 is "High" or "Low", thereby making it possible to compare the measured analog value $V_{in}$ with the set analog values.

Thus, in the A/D conversion device of the prior art, comparison and determination of the measured analog value $V_{in}$ are made with respect to a threshold by using the comparator function. After that, the comparator function is switched to the A/D conversion function to convert an analog value into a digital value, thereby achieving a reduction in processing time required for the A/D conversion. Specifically, when a digital value of 2 V or greater among analog inputs within a range of 0 V to 5 V is required, for example, the need for processing to determine whether the analog input is equal to or higher than 2 V and to convert an analog value into a digital value every time the analog input is lower than 2 V is eliminated.

Meanwhile, Japanese Unexamined Patent Application Publication No. 56-13830 discloses a technique that has the effect of eliminating noise in an A/D conversion device, though the technique does not involve A/D conversion of an analog voltage higher than a threshold, unlike the technique disclosed in Japanese Unexamined Patent Application Publication No. 61-125231. According to the technique disclosed in Japanese Unexamined Patent Application Publication No. 56-13830, a previous A/D conversion result is stored, and when an analog voltage to be subjected to A/D conversion falls within a desired range, noise elimination is carried out without performing any A/D conversion operation. This results in a reduction in waste of the A/D conversion time. The technique disclosed in Japanese Unexamined Patent Application Publication No. 56-13830 has a drawback in that, when excessive noise occurs, it is necessary to perform A/D conversion four to eight times in order to restore the normal and stable operation.

SUMMARY

The present inventor has found problems as described below. As described above, the A/D conversion device disclosed in Japanese Unexamined Patent Application Publication No. 61-125231 has the comparator function for excluding analog voltages which are out of a specified range, from the A/D conversion targets, so as to reduce the A/D conversion time. In Japanese Unexamined Patent Application Publication No. 61-125231, however, as shown in the timing diagram of FIG. 6, after the determination result of the comparator operation is output, the microcomputer 106 reads the determination result and issues an instruction to start the A/D conversion function. In other words, continuous execution of the comparator operation and switching from the comparator function to the A/D conversion function are carried out by means of software processing by the microcomputer 106. This poses a problem in that it takes a long time to re-execute the comparator operation and to perform switching processing from the comparator function to the A/D conversion function.

Furthermore, when noise is superimposed on the analog input during the comparator operation, the noise may be erroneously determined as falling within a specific range. As a result, the microcomputer 106 issues an instruction to start the A/D conversion function. In this case, however, the analog input is set outside the specific range, because of the noise, which causes a problem of a waste of the A/D conversion time.

A first exemplary aspect of the present invention is an A/D conversion device capable of switching between a comparator function and an A/D conversion function, including: a sample-and-hold circuit that holds a received input analog voltage; a sequential conversion register that stores a digital value corresponding to a threshold for comparison and determination in the comparator function; a D/A converter that generates an analog voltage corresponding to the digital value stored in the sequential conversion register; a comparator that compares an analog voltage output from the sample-and-hold circuit with an analog voltage obtained from the D/A converter, and outputs a comparison result; a comparison result counter that outputs a determination result according to a count number counted based on the comparison result; and a control circuit that performs control for switching from the comparator function to the A/D conversion function, based on the determination result. During operation of the A/D conversion function, the sequential conversion register performs an A/D conversion processing for sequentially converting the analog voltage held in the sample-and-hold circuit into a digital value.

With this configuration, the continuous execution of the comparator operation and switching from the comparator function to the A/D conversion function can be carried out without requiring software processing by a microcomputer. This makes it possible to reduce the time required to re-execute the comparator operation and to perform switching processing from the comparator function to the A/D conversion function.

According to the present invention, it is possible to provide an A/D conversion device capable of effectively shortening the processing time.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
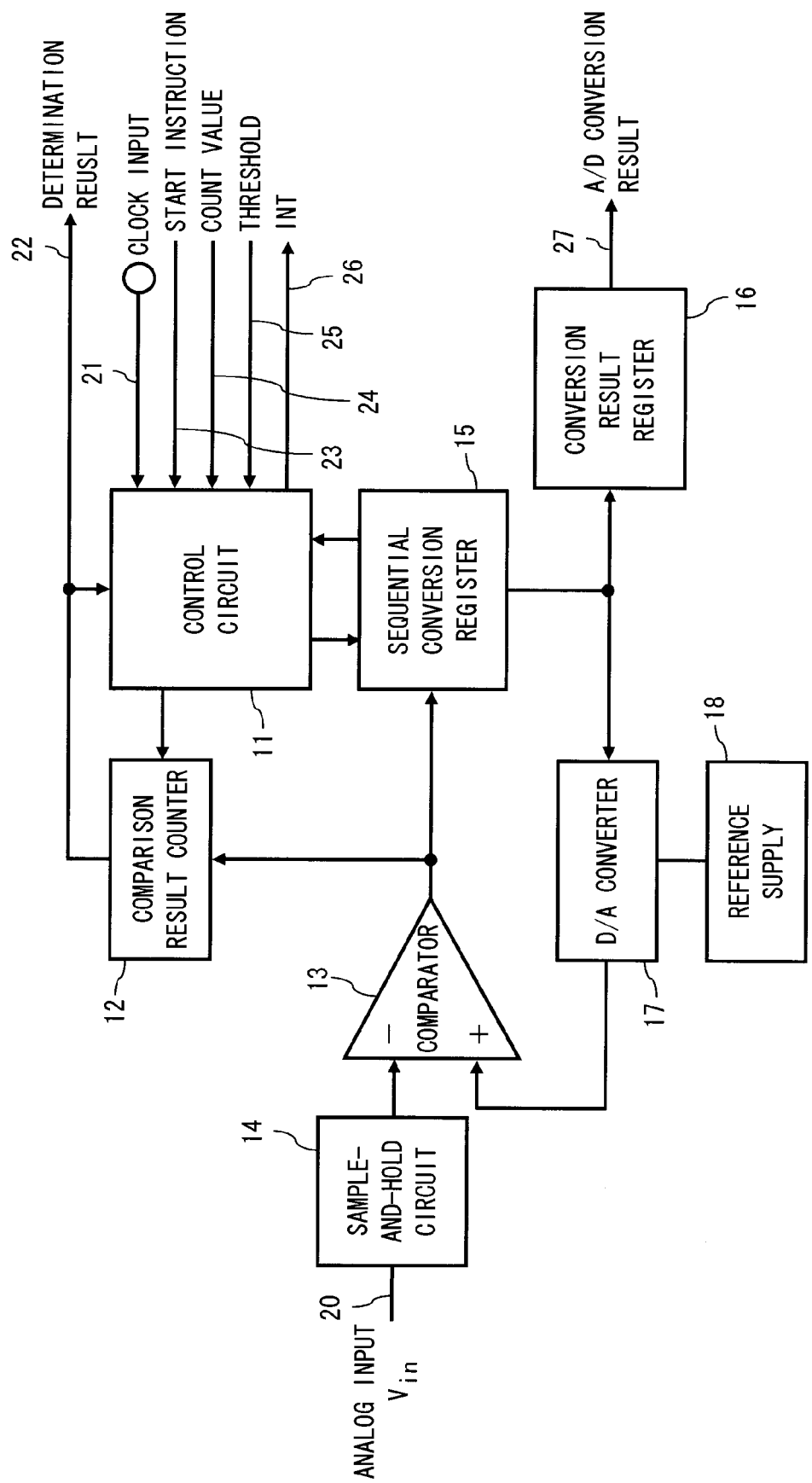
FIG. 1 is a block diagram showing an exemplary configuration of an A/D conversion device according to a first exemplary embodiment of the present invention.

Exemplary embodiments of the present invention will be described below with reference to the accompanying drawings. In the following description and the drawings, omissions and simplifications are made as necessary for clarity of explanation. Note that like elements are designated by identical reference numerals throughout the drawings, and description thereof is omitted as necessary.

First Exemplary Embodiment

Referring first to FIG. 1, an exemplary configuration of an A/D conversion device according to this exemplary embodiment will be described. FIG. 1 is a block diagram showing an exemplary configuration of an A/D conversion device according to a first exemplary embodiment of the present invention. The A/D conversion device according to this exemplary embodiment is capable of switching between a comparator function and an A/D conversion function. In other words, the A/D conversion device has both the comparison function and the A/D conversion function, which can be switched from one to the other.

The A/D conversion device according to this exemplary embodiment includes a control circuit 11, a comparison result counter 12, a comparator 13, a sample-and-hold circuit 14, a sequential conversion register 15, a conversion result register 16, a D/A converter 17, and a reference supply 18.

The control circuit 11 receives a start instruction 23 for starting an operation, a count value 24 for comparison and determination, a threshold 25, and a clock input 21. The control circuit 11 outputs a digital value corresponding to the received threshold 25 to the sequential conversion register 15. Further, the control circuit 11 sets the received count value 24 to the comparison result counter 12.

The sample-and-hold circuit 14 receives an analog input $V_{in}$ 20. During a comparator function operation, the sample-and-hold circuit 14 performs sampling processing on the received analog input $V_{in}$ 20 and holds the voltage. The output of the sample-and-hold circuit 14 is connected to the minus input terminal of the comparator 13. Note that the sample-and-hold circuit 14 performs sampling processing upon starting the comparator function operation, and does not perform resampling processing during an A/D conversion function operation to be carried out after the sampling processing.

The D/A converter 17 is supplied with a reference voltage from the reference supply 18, and converts the digital value stored in the sequential conversion register 15 into an analog value. Specifically, the D/A converter 17 generates an analog voltage corresponding to the digital value supplied from the sequential conversion register 15, by using the reference voltage supplied from the reference supply 18. The output of the D/A converter 17 is connected to the plus input terminal of the comparator 13.

The comparator 13 compares voltages received at the input terminals, and outputs a comparison result. Specifically, the comparator 13 compares an analog voltage output from the sample-and-hold circuit 14 with an analog voltage obtained from the D/A converter 17. The output of the comparator 13 is connected to each of the sequential conversion register 15 and the comparison result counter 12.

The comparison result counter 12 performs counting according to the comparison result received from the comparator 13, and outputs a determination result according to a count number. Specifically, when the comparison result received from the comparator 13 matches a previous comparison result, the comparison result counter 12 performs counting. Meanwhile, when the comparison results do not match, the comparison result counter 12 clears the count number to 0. Then, the comparison result counter 12 determines whether the count number counted by the counter is equal to or greater than the set count value 24, and outputs a determination result 22. The comparison result counter 12 outputs the determination result 22 to the control circuit 11. The comparison result counter 12 may output the determination result 22 to the outside.

The control circuit 11 includes a comparator control circuit (not shown) that allows the comparator function to be continuously operated, and an A/D conversion control circuit (not shown) that allows the A/D conversion function operation to be started depending on the comparison result obtained during the comparator function operation. The control circuit 11 performs control for switching from the comparator function to the A/D conversion function, by using the determination result 22, which is received from the comparison result counter 12, as a start trigger. After the A/D conversion is completed, the control circuit 11 outputs an INT 26 serving as a conversion end signal.

The sequential conversion register 15 stores the digital value which is received from the control circuit 11 and which corresponds to the threshold 25. Further, during the A/D conversion function operation, the sequential conversion register 15 holds the comparison result output from the comparator 13 and executes A/D conversion. Specifically, the sequential conversion register 15 sequentially converts the analog voltage held in the sample-and-hold circuit 14. In other words, when the comparator function is switched to the A/D conversion function, the sequential conversion register 15 performs A/D conversion by directly using the voltage of the analog input $V_{in}$ 20 stored in the sample-and-hold circuit 14. The sequential conversion register 15 then outputs the digital value obtained through conversion to the conversion result register 16.

The conversion result register 16 holds the digital value, which is obtained after the A/D conversion and received from the sequential conversion register 15, and outputs the digital value as an A/D conversion result 27.

Figure 2A:
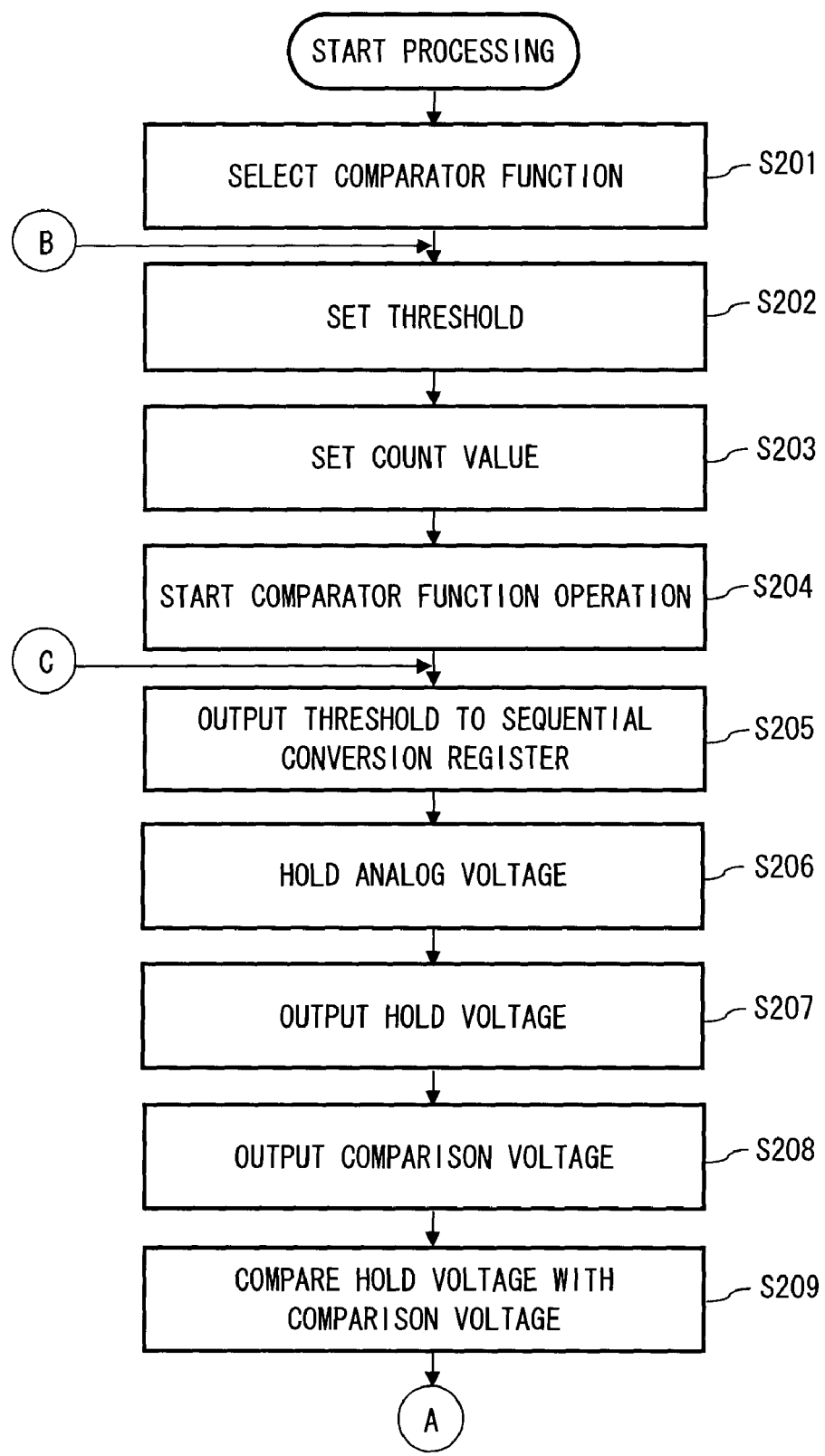
FIGS. 2A to 2B are flowcharts showing a flow of a method for controlling the A/D conversion device according to the first exemplary embodiment.
Figure 2B:
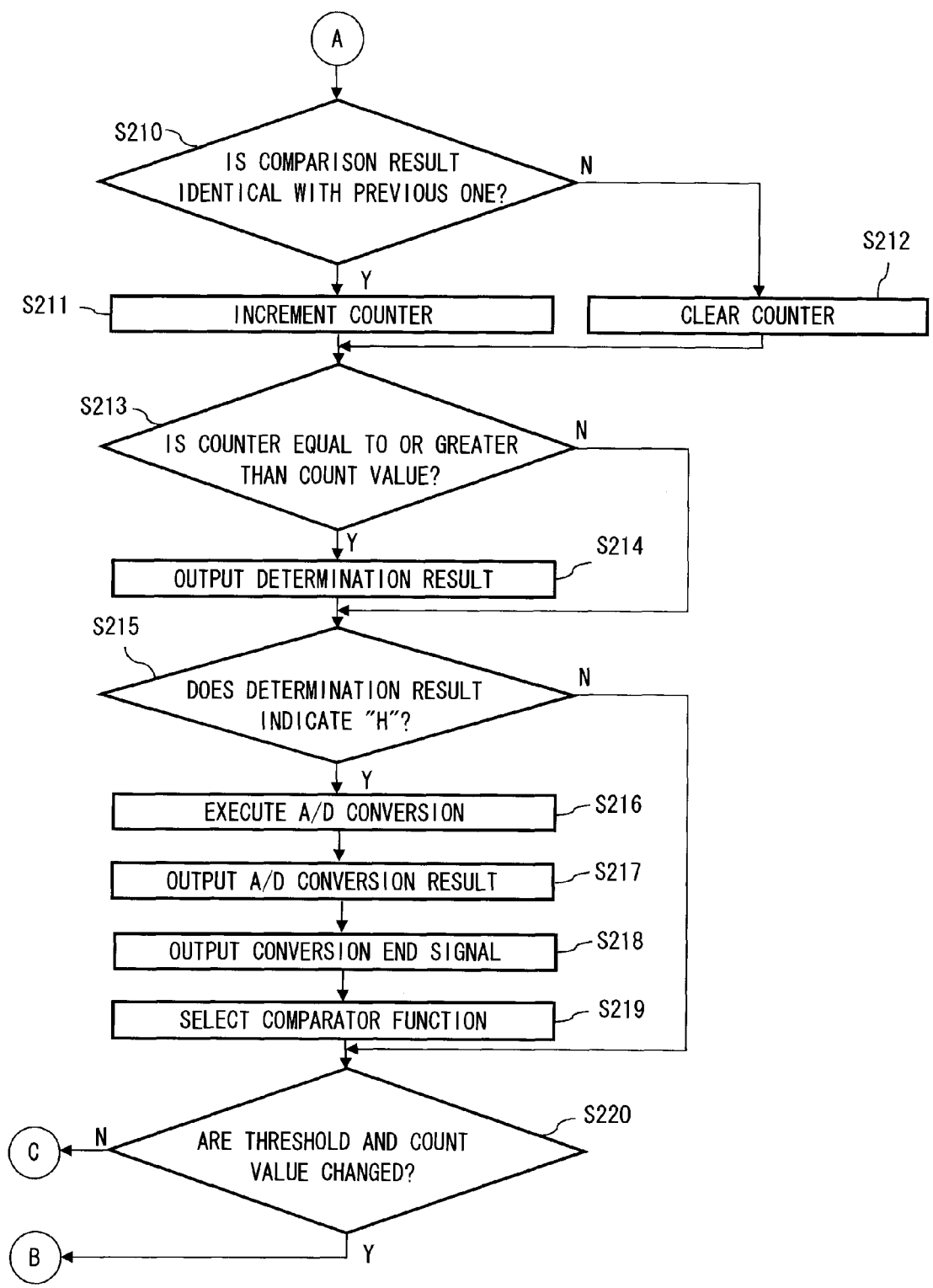

Referring next to FIGS. 2A to 2B, a method for controlling the A/D conversion device according to this exemplary embodiment will be described. FIGS. 2A to 2B are flowcharts showing a flow of the method for controlling the A/D conversion device according to the first exemplary embodiment.

As shown in FIGS. 2A to 2B, when the A/D conversion device is activated, the control circuit 11 selects the comparator function (S201). Then, the threshold 25 used for the comparator function is set to the control circuit 11 (S202). Further, the count value 24 is input to the control circuit 11, and the count value for comparison and determination is set (S203). Specifically, the control circuit 11 sets the received count value 24 to the comparison result counter 12.

When the start instruction 23 for starting the comparator function is input to the control circuit 11, the A/D conversion device starts the comparator function operation (S204). The control circuit 11 outputs a digital value corresponding to the set threshold 25 to the sequential conversion register 15 (S205), and the sequential conversion register 15 holds the digital value.

Next, the sample-and-hold circuit 14 receives the analog voltage supplied from the analog input $V_{in}$ 20, and holds the received analog voltage (S206). Then, the sample-and-hold circuit 14 outputs the analog voltage held therein (hold voltage) to the comparator 13 (S207). Meanwhile, the D/A converter 17 outputs an analog voltage for comparison (comparison voltage) to the comparator 13 based on the reference voltage supplied from the reference supply 18 and on the digital data received from the sequential conversion register 15 (S208). In this case, an analog voltage corresponding to the threshold 25 is output as the comparison voltage.

Figure 3:
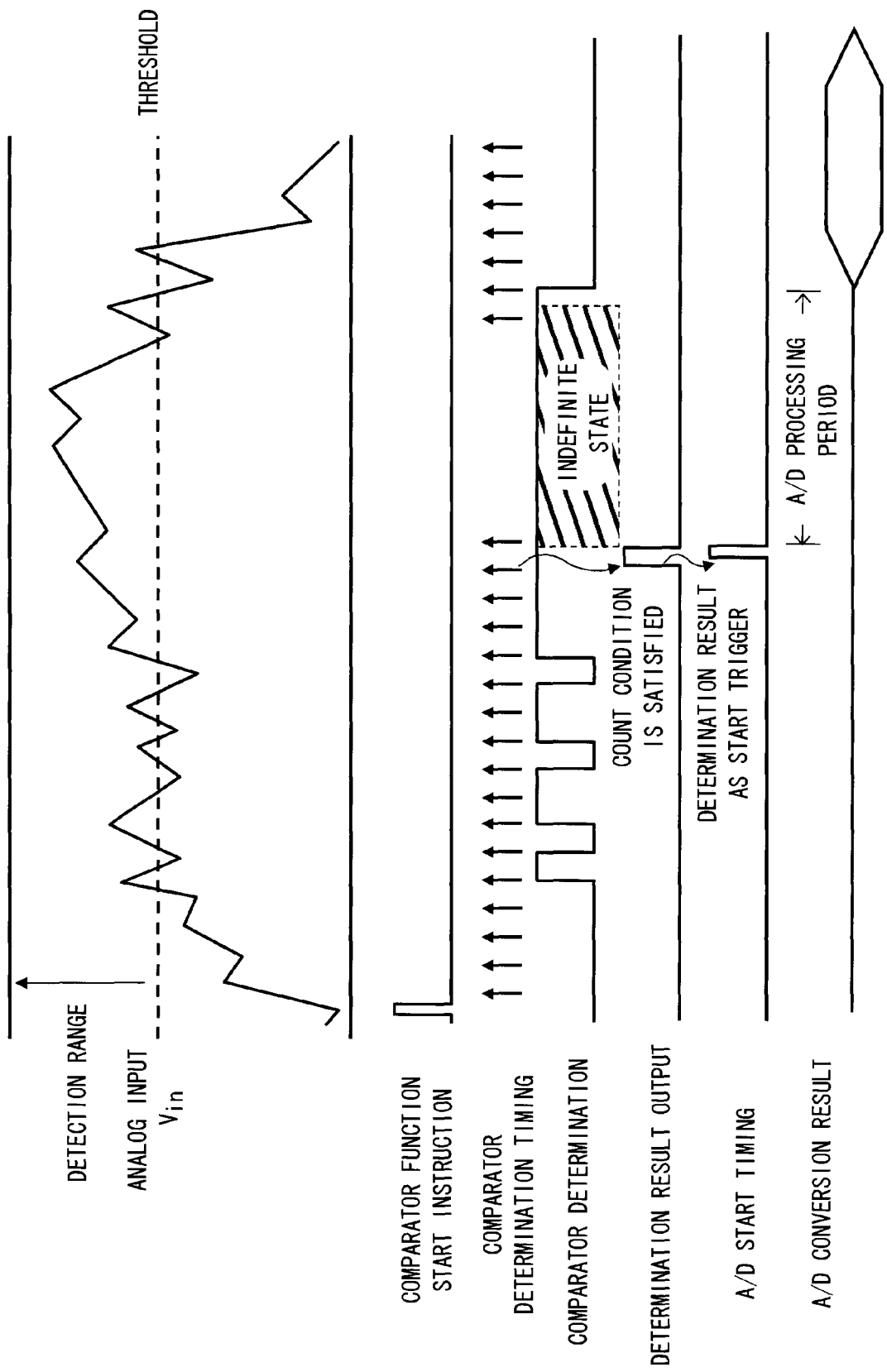
FIG. 3 is a timing diagram showing operation of the A/D conversion device according to the first exemplary embodiment.

The comparator 13 compares the analog voltage (hold voltage) received from the sample-and-hold circuit 14 with the analog voltage (comparison voltage) corresponding to the threshold 25 for comparison and determination received from the D/A converter 17 (S209), and outputs the comparison result. As shown in FIG. 3, for example, when the hold voltage received from the sample-and-hold circuit 14 is higher than the comparison voltage received from the D/A converter 17, the comparison result is output as "High". Meanwhile, when the hold voltage is lower than the comparison voltage, the comparison result is output as "Low". A comparator determination is made in a manner as described above.

The comparison result counter 12 determines whether the comparison result output from the comparator 13 matches the previous comparison result (S210). Specifically, the comparison result counter 12 determines whether an output signal from the comparator 13 is identical with a previous output signal from the comparator 13. When the signals match, the counter performs counting to increment its count (S211). When the signals do not match, the counter clears the count number to 0 (S212).

Subsequently, the comparison result counter 12 determines whether the count number of the counter is equal to or greater than the count value 24 set by the control circuit 11 (S213). When the count number is equal to or greater than the set count value 24, the comparison result counter 12 determines that the count condition is satisfied, and outputs "High" as the determination result 22 (S214). When the count number is smaller than the set count value 24, the comparison result counter 12 outputs "Low" as the determination result 22.

Then, the control circuit 11 determines whether the determination result 22 received from the comparison result counter 12 indicates "H" (High) or not (S215).

When the determination result 22 indicates "H" in the determination of S215, the function is switched to the A/D conversion function. Specifically, the control circuit 11 performs control for switching from the comparator function to the A/D conversion function by using the determination result 22, which is received from the comparison result counter 12, as a trigger. Thus, in this exemplary embodiment, the A/D conversion function is started in accordance with the determination result of the comparator function operation. Then, A/D conversion is executed (S216). In this case, the sequential conversion register 15 carries out A/D conversion processing to convert the analog voltage held in the sample-and-hold circuit 14 into a digital value. At this time, a binary search, which is a detection method for A/D conversion of a sequential conversion type, is started from a value set as the threshold in a comparator operation. This makes it possible to reduce the number of binary searches and shorten the time period required for the A/D conversion processing. Note that, during the period of the A/D conversion processing, the sample-and-hold circuit 14 performs no resampling operation for receiving the analog voltage supplied from the analog input $V_{in}$ 20.

Upon completion of the A/D conversion processing, the sequential conversion register 15 outputs a digital value obtained through conversion. The conversion result register 16 holds the digital value, which is obtained through A/D conversion and received from the sequential conversion register 15, and outputs the digital value as the A/D conversion result 27 (S217). The control circuit 11 outputs the INT 26 serving as the conversion end signal (S218) to select the comparator function (S219). In other words, after the A/D conversion processing is completed, the control circuit 11 allows the comparator function operation to be re-executed.

After that, it is determined whether the threshold and the count number are changed or not (S220). When the set value of the threshold 25 and the count number of the comparison result counter 12 are changed to continue the operation, the process returns to S202. When the operation is continued while the current setting is maintained, the process returns to S205. Note that when the determination result 22 does not indicate "H" in the determination of S215, the process shifts to S220 without executing steps S216 to S219. That is, the comparator function operation is continued without switching to the A/D conversion function.

Referring now to FIG. 3, a description is given of the operation of the A/D conversion device according to this exemplary embodiment configured as described above. FIG. 3 is a timing diagram showing the operation of the A/D conversion device according to this exemplary embodiment. The following description will be made by comparing, if necessary, the operation of the A/D conversion device of this exemplary embodiment with the operation of the A/D conversion device according to the prior art disclosed in Japanese Unexamined Patent Application Publication No. 61-125231.

Referring to FIG. 3, in this exemplary embodiment, when the start instruction 23 for starting the comparator function operation is input, continuous execution of the comparator operation is automatically performed. That is, the comparator determination is continuously made at a predetermined timing. The comparator operation is continuously carried out until the comparator determination satisfies a predetermined count condition. When the comparator determination satisfies the predetermined count condition, the function is switched from the comparator function to the A/D conversion function. Specifically, as described above, the comparison result counter 12 outputs "High" as the determination result 22, and starts the A/D conversion processing by using the output as a start trigger. Note that during the A/D conversion processing period, the A/D conversion device is in an indefinite state in which the comparator determination is not made. After the A/D conversion processing is completed, the A/D conversion result 27 is output and the INT 26 serving as the conversion end signal is also output, thereby allowing the comparator operation to be re-executed.

Figure 6:
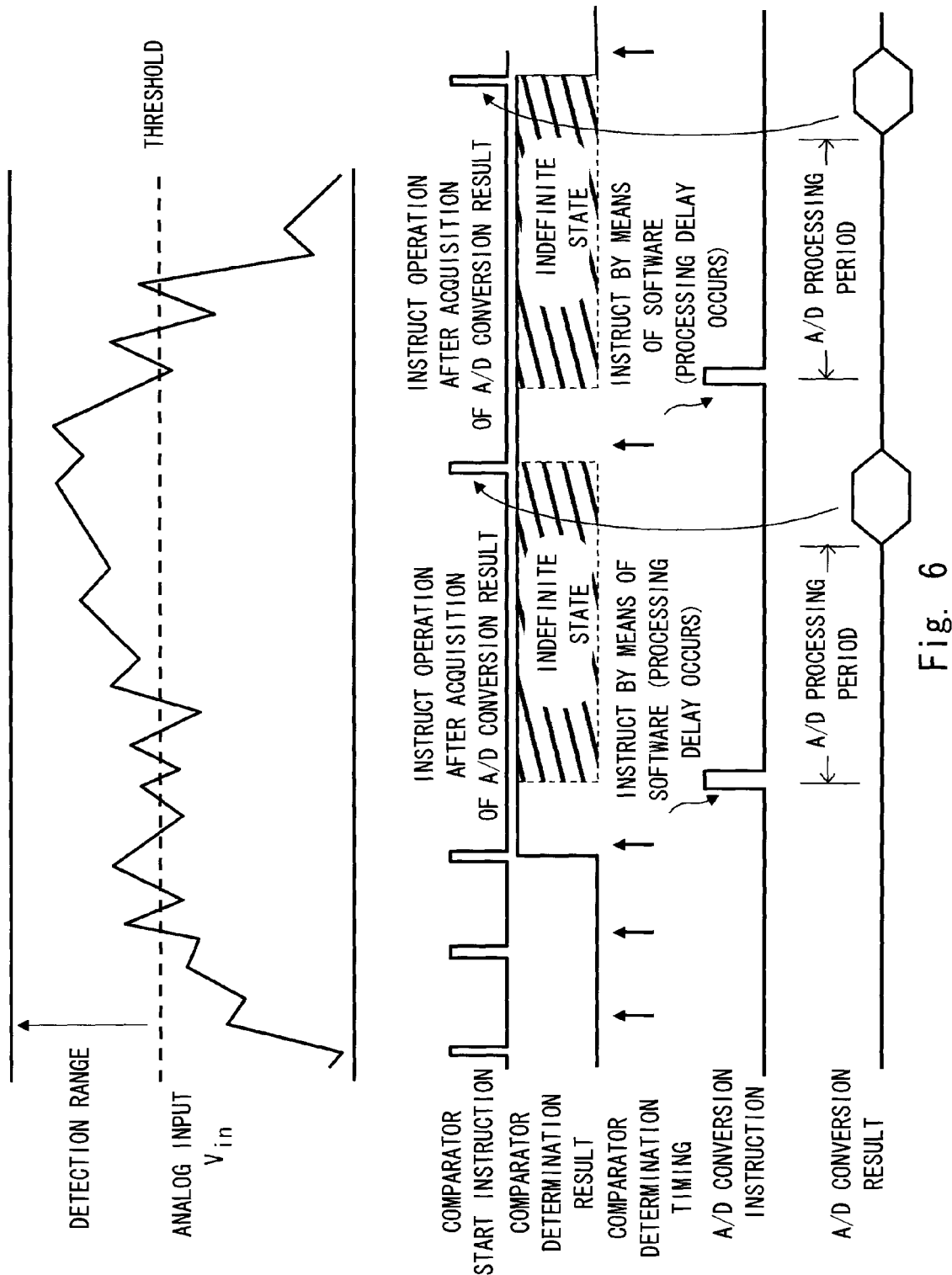
FIG. 6 is a timing diagram showing operation of the A/D conversion device of the prior art.

Referring now to the timing diagram of FIG. 6, in the A/D conversion device of the prior art, a microcomputer 106 reads a determination result of a comparator operation after the determination result is output, and outputs a start command for starting the A/D conversion function. In other words, the continuous execution of the comparator operation and switching from the comparator function to the A/D conversion function are carried out by means of software processing by the microcomputer 106. For this reason, a waiting time for waiting the determination of the microcomputer 106 occurs every time the comparator operation is completed, and it takes a long time to re-execute the comparator operation and to perform switching processing from the comparator function to the A/D conversion function. Moreover, the analog input $V_{in}$ varies from moment to moment during the waiting period, so the determination result of the comparator operation does not match the A/D conversion result.

On the other hand, in this exemplary embodiment, the comparator control circuit which allows continuous operation is provided in the control circuit 11. This allows the continuous execution of the comparator operation to be automatically performed after the start instruction 23 for starting the comparator function operation is input. Specifically, as shown in FIG. 3, after the determination result of the comparator operation is output, a subsequent comparator operation can be immediately started without requiring software processing. Therefore, there is no waiting time for waiting the operation start instruction. Thus, the A/D conversion device of this exemplary embodiment can shorten the time required to perform the processing for re-executing the comparator operation, compared to the A/D conversion device of the prior art.

Further, in this exemplary embodiment, the A/D conversion control circuit which uses the comparison result of the comparator operation as a start trigger is provided in the control circuit 11. This makes it possible to start A/D conversion in accordance with the determination result of the comparator operation. Specifically, as shown in FIG. 3, after the determination result of the comparator operation is output, the A/D conversion can be started immediately without requiring software processing. Therefore, there is no waiting state for waiting the operation start instruction. Thus, the A/D conversion device of this exemplary embodiment can shorten the time required to perform switching processing from the comparator function to the A/D conversion function, compared to the A/D conversion device of the prior art.

Furthermore, in this exemplary embodiment, the analog input $V_{in}$ 20 used for the comparator operation is also be used as an input for the A/D conversion. For this reason, the determination result of the comparator operation matches the A/D conversion result. In general, the analog input $V_{in}$ varies around a threshold. The A/D conversion device of the prior art outputs the start command for starting the A/D conversion function in the case where the comparator operation is carried out when the analog input exceeds the threshold even by a small amount. In some cases, the A/D conversion device of the prior art carries out A/D conversion in the state where the analog input $V_{in}$ varies during the waiting state and does not exceed the threshold. This leads to a waste of an A/D conversion time. Meanwhile, in this exemplary embodiment, the provision of the comparison result counter 12 makes it possible to perform an A/D conversion operation at the time when the analog input $V_{in}$ 20 certainly exceeds the threshold 25. In other words, even when noise is superimposed on the analog input $V_{in}$ 20, the comparator operation can be re-executed without making an erroneous determination that the noise falls within a specific range, and a determination as to whether the analog input $V_{in}$ 20 falls within the specific range can be made. Thus, it is possible to realize functions of a digital noise filter for preventing an abnormal variation in the analog input $V_{in}$ 20 due to noise and fluctuations in determination around the threshold. Therefore, a waste of the A/D conversion time due to an erroneous determination can be avoided.

As described above, in the A/D conversion device of this exemplary embodiment, the continuous execution of the comparator operation and switching from the comparator function to the A/D conversion function are carried out without requiring software processing by a microcomputer. This makes it possible to shorten the time required to re-execute the comparator operation and to perform switching processing from the comparator function to the A/D conversion function. Further, the switching from the comparator function to the A/D conversion function is carried out when the comparator determination satisfies the predetermined count condition. Thus, a waste of the A/D conversion time due to noise or an erroneous determination can be avoided. Furthermore, during the A/D conversion processing, the voltage of the analog input $V_{in}$ 20, which is stored in the sample-and-hold circuit 14, is directly used. As a result, the A/D conversion result matches the comparator determination result, and a waste of the A/D conversion time can be avoided. Moreover, the binary search, which is a detection method for A/D conversion of a sequential conversion type, is started from the value set as the threshold in the comparator operation. This makes it possible to shorten the A/D conversion processing time. Consequently, according to this exemplary embodiment, it is possible to provide an A/D conversion device capable of effectively shortening the processing time.

Second Exemplary Embodiment

Figure 4:
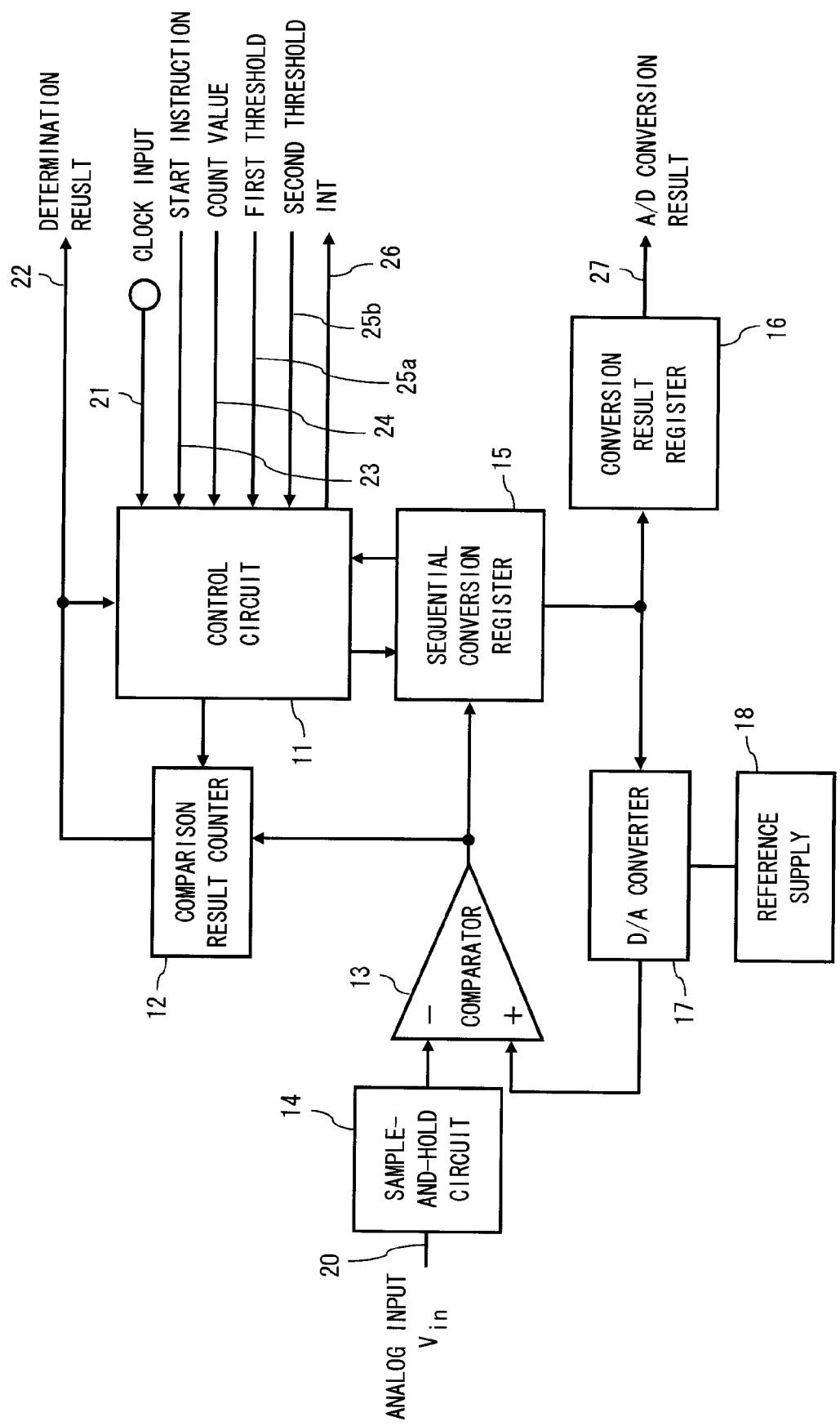
FIG. 4 is a block diagram showing an exemplary configuration of an A/D conversion device according to a second exemplary embodiment of the present invention.
Figure 5:
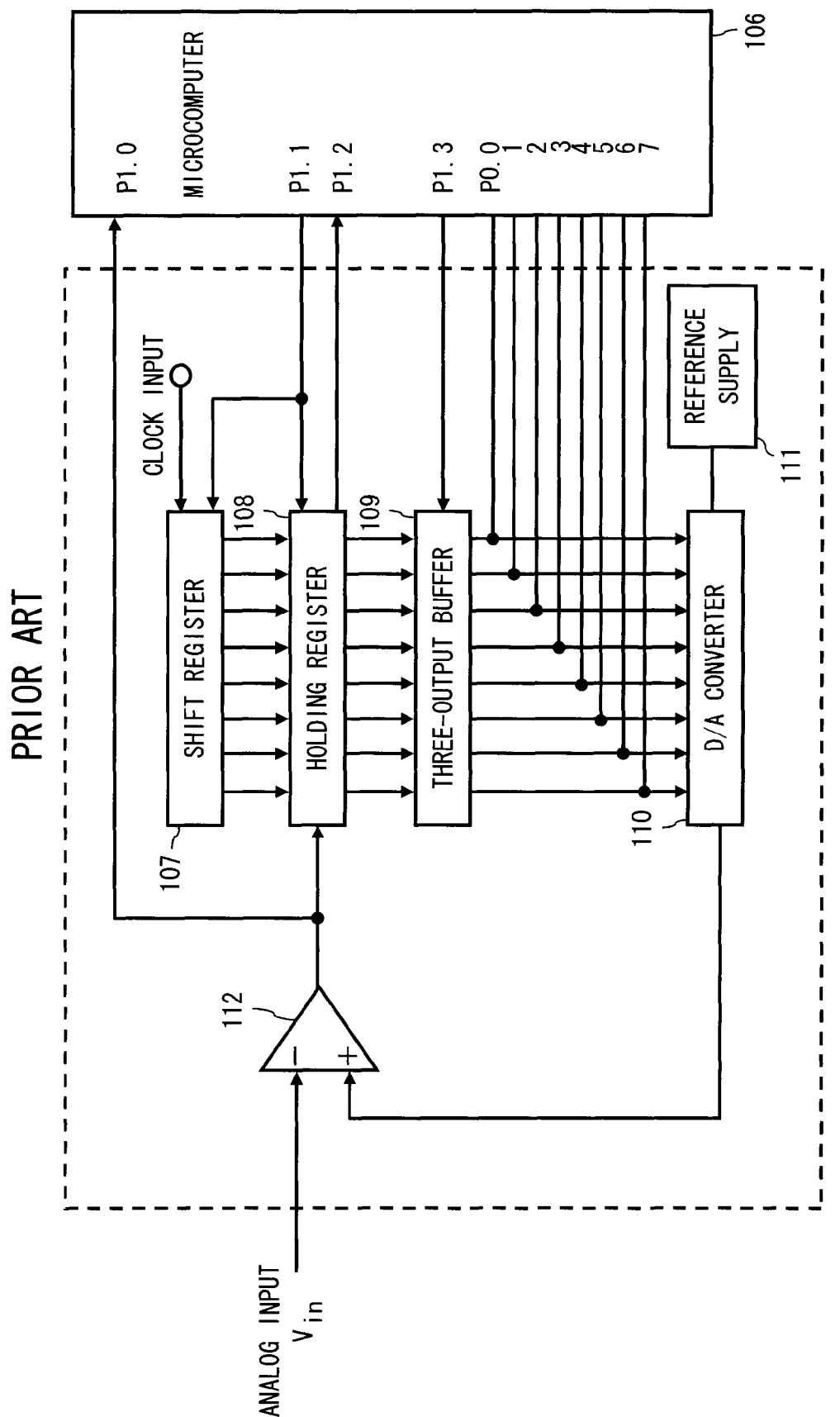
FIG. 5 is a block diagram showing an exemplary configuration of an A/D conversion device of a prior art.

An exemplary configuration of an A/D conversion device according to a second exemplary embodiment of the present invention will be described with reference to FIG. 4. FIG. 4 is a block diagram showing the configuration of the A/D conversion device according to the second exemplary embodiment.

In the first exemplary embodiment, a description has been given of an example in which the A/D conversion device according to the present invention is applied to the case of switching from the comparator function to the A/D conversion function when the analog input $V_{in}$ 20 is equal to or greater than a specific voltage, or equal to or less than the specific voltage. Meanwhile, in this exemplary embodiment, a description will be given of an example in which the A/D conversion device according to the present invention is applied to a case of switching from the comparator function to the A/D conversion function when the analog input $V_{in}$ 20 falls within a specific voltage range.

In the first exemplary embodiment, the control circuit 11 receives a single threshold 25, while in this exemplary embodiment, the control unit 11 receives two thresholds 25. Specifically, as shown in FIG. 4, the control circuit 11 receives a first threshold 25a and a second threshold 25b. The control circuit 11 further includes, for example, a storage register (not shown) that holds the first threshold 25a and the second threshold 25b. The control circuit 11 alternately outputs, to the sequential conversion register 15, digital values corresponding to the received first threshold 25a and the second threshold 25b.

The sequential conversion register 15 and the comparator 13 process the two thresholds 25, i.e., the first threshold 25a and the second threshold 25b. Specifically, the sequential conversion register 15 alternately stores the digital values corresponding to the first threshold 25a and the second threshold 25b. Then, the comparator 13 compares an analog voltage output from the sample-and-hold circuit 14 with each of the first threshold 25a and the second threshold 25b which are output from the sequential conversion register 15.

The comparison result counter 12 has a control function for setting a count register twice. Specifically, the comparison result counter 12 outputs the determination result 22 according to the count number counted based on a comparison result corresponding to the first threshold 25a and on a comparison result corresponding to the second threshold 25b, the comparison results being output from the comparator 13. In the case where the first threshold 25a is smaller than the second threshold 25b, for example, the comparison result counter 12 performs counting when the comparison result of the comparator 13 corresponding to the first threshold 25a indicates "High". Meanwhile, when the comparison result corresponding to the first threshold 25a indicates "Low", the comparison result counter 12 clears the count number. Subsequently, when the comparison result of the comparator 13 corresponding to the second threshold 25b indicates "High", the comparison result counter 12 clears the count number. Meanwhile, when the comparison result corresponding to the second threshold 25b indicates "Low", the comparison result counter 12 performs counting. Then, the comparison result counter 12 determines whether the counter number is equal to or greater than a set count value, and outputs the determination result 22. The other configurations are similar to those of the first exemplary embodiment, so the description thereof is omitted.

Next, a description is given of a method for controlling the A/D conversion device according to this exemplary embodiment. Herein, a description of steps identical with those of the flowchart of the first exemplary embodiment shown in FIGS. 2A to 2B will be omitted, and only differences will be described.

In this exemplary embodiment, in S202, the first threshold 25a and the second threshold 25b are set to the control circuit 11. Then, in S205, the digital values corresponding to the first threshold 25a and the second threshold 25b, which have been set to the control circuit 11, are output to the sequential conversion register 15. Further, the flow from S208 to S212 is repeated twice. For example, the value of the first threshold 25a is used for the first flow, and the value of the second threshold 25b is used for the second flow. In this case, in S210, assuming that the first threshold 25a is smaller than the second threshold 25b, for example, when a first comparison result indicates "High", the counter performs counting. Meanwhile, when the first comparison result indicates "Low", the counter clears the count number. Then, when a second comparison result indicates "High", the counter clears the count number. Meanwhile, when the second comparison result indicates "Low", the counter performs counting.

Thus, when the analog voltage output from the sample-and-hold circuit 14 falls within a voltage range between the first threshold 25a and the second threshold 25b, the comparison result counter 12 performs counting. This makes it possible to execute the A/D conversion function when the analog input $V_{in}$ 20 falls within a specific voltage range. For example, assuming that the analog input $V_{in}$ 20 falls within a range of 0 V to 5 V and that the first threshold 25a is set to 2V and the second threshold 25b is set to 3 V, the A/D conversion function is executed when the voltage falls within a range of 2 V to 3 V.

As described above, in this exemplary embodiment, the storage register for holding the first threshold 25a and the second threshold 25b is provided in the control circuit 11, and the count register provided in the comparison result counter 12 is set twice. As a result, the thresholds 25 can be set as upper and lower thresholds for determining the comparator operation, and A/D converted values within a desired range can be obtained by the operation with no waste as in the first exemplary embodiment. The setting of the two thresholds 25 makes it possible to shorten the processing time when an A/D conversion result within a more limited range of a desired region is required. Moreover, effects similar to those of the first exemplary embodiment can be obtained.

Note that the present invention is not limited to the exemplary embodiments described above, and can be modified in various ways without departing from the scope of the present invention. For example, while in the second exemplary embodiment, a description has been given of the case of switching from the comparator function to the A/D conversion function when the analog input $V_{in}$ 20 falls within a specific voltage range, the switching from the comparator function to the A/D conversion function may be performed when the analog input is out of the specific voltage range.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An A/D conversion device capable of switching between a comparator function and an A/D conversion function, comprising:
   a sample-and-hold circuit that holds a received input analog voltage;
   a sequential conversion register that stores a digital value corresponding to a threshold for comparison and determination in the comparator function;
   a D/A converter that generates an analog voltage corresponding to the digital value stored in the sequential conversion register;
   a comparator that compares an analog voltage output from the sample-and-hold circuit with an analog voltage obtained from the D/A converter, and outputs a comparison result;
   a comparison result counter that outputs a determination result according to a count number counted based on the comparison result; and
   a control circuit that performs control for switching from the comparator function to the A/D conversion function, based on the determination result,
   wherein, during operation of the A/D conversion function, the sequential conversion register performs an A/D conversion processing for sequentially converting the analog voltage held in the sample-and-hold circuit into a digital value.

2. The A/D conversion device according to claim 1, wherein, during operation of the comparator function, the comparator compares an analog voltage output from the sample-and-hold circuit with an analog voltage corresponding to the threshold and obtained from the D/A converter, and outputs the comparison result.

3. The A/D conversion device according to claim 1, wherein the control circuit comprises:
   a comparator control circuit that allows the comparator function to be continuously operated; and
   an A/D conversion control circuit that starts operation of the A/D conversion function according to the comparison result obtained during operation of the comparator function.

4. The A/D conversion device according to claim 1, wherein
   the sample-and-hold circuit performs a sampling processing on the input analog voltage during operation of the comparator function, and
   the sample-and-hold circuit performs no sampling processing on the input analog voltage during operation of the A/D conversion function.

5. The A/D conversion device according to claim 1, wherein the comparison result counter performs counting when the comparison result output from the comparator matches a previous comparison result, and clears the count value to 0 when the comparison result output from the comparator does not match the previous comparison result.

6. The A/D conversion device according to claim 1, wherein when the count value is equal to or greater than a preset count value, the comparison result counter outputs the determination result indicating that a count condition is satisfied.

7. The A/D conversion device according to claim 1, wherein the control circuit allows operation of the comparator function to be re-executed, after the A/D conversion processing is completed by the sequential conversion register.

8. The A/D conversion device according to claim 1, further comprising a conversion result register that holds a digital value obtained after A/D conversion and received from the sequential conversion register, and outputs the digital value as an A/D conversion result.

9. The A/D conversion device according to claim 1, wherein
   the sequential conversion register alternately stores digital values corresponding to a first threshold and a second threshold, and
   the comparison result counter outputs the determination result according to a count value counted based on both the comparison result corresponding to the first threshold and the comparison result corresponding to the second threshold, the comparison results being output from the comparator.

10. The A/D conversion device according to claim 9, wherein when the analog voltage output from the sample-and-hold circuit falls within a voltage range between the first threshold and the second threshold, the comparison result counter performs counting.

* * * * *